United States Patent
Xue et al.

(10) Patent No.: US 9,435,825 B2
(45) Date of Patent: *Sep. 6, 2016

(54) MULTI-CHANNEL PROBE PLATE FOR SEMICONDUCTOR PACKAGE TEST SYSTEMS

(71) Applicant: Infineon Technologies AG, Neubiberg (DE)

(72) Inventors: Ming Xue, Singapore (SG); Chow York Lee, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/812,633

(22) Filed: Jul. 29, 2015

(65) Prior Publication Data

US 2015/0331013 A1 Nov. 19, 2015

Related U.S. Application Data

(63) Continuation of application No. 13/912,721, filed on Jun. 7, 2013, now Pat. No. 9,121,884.

(51) Int. Cl.
| | |
|---|---|
| *G01R 31/00* | (2006.01) |
| *G01R 1/04* | (2006.01) |
| *G01R 31/04* | (2006.01) |
| *G01R 1/07* | (2006.01) |
| *G01R 31/28* | (2006.01) |
| *G01R 31/312* | (2006.01) |

(52) U.S. Cl.
CPC ............... *G01R 1/0466* (2013.01); *G01R 1/07* (2013.01); *G01R 31/041* (2013.01); *G01R 31/2889* (2013.01); *G01R 31/2896* (2013.01); *G01R 31/312* (2013.01)

(58) Field of Classification Search
CPC ....... G01R 33/16; G01R 1/07; G01R 31/041
See application file for complete search history.

(56) References Cited

U.S. PATENT DOCUMENTS

| | | | |
|---|---|---|---|
| 5,254,953 A | 10/1993 | Crook et al. | |
| 5,469,064 A * | 11/1995 | Kerschner ................ | G01R 1/07 324/537 |
| 7,129,729 B2 * | 10/2006 | Ho ...................... | G01R 31/2896 324/756.02 |
| 2013/0049766 A1 | 2/2013 | Schoenberger et al. | |
| 2013/0049792 A1 | 2/2013 | Xue | |

* cited by examiner

*Primary Examiner* — Tung X Nguyen
(74) *Attorney, Agent, or Firm* — Murphy, Bilak & Homiller, PLLC

(57) ABSTRACT

A test apparatus includes a multi-channel probe plate having an electrically insulating body with opposing first and second main surfaces, and a plurality of spaced apart electrically conductive coupling regions embedded in or attached to the body at the first main surface. Each of the electrically conductive coupling regions is configured to cover a different zone of a semiconductor package when the semiconductor package is positioned in close proximity to the first main surface of the plate. The test apparatus further includes circuitry electrically connected to each of the coupling regions of the probe plate via a different channel. The circuitry is operable to measure a parameter indicative of the degree of capacitive coupling between each electrically conductive coupling region of the probe plate and the zone of the semiconductor package covered by the corresponding electrically conductive coupling region.

20 Claims, 7 Drawing Sheets

MULTI-CHANNEL PROBE PLATE FOR SEMICONDUCTOR PACKAGE TEST SYSTEMS

TECHNICAL FIELD

The instant application relates to semiconductor packages and, more particularly, to capacitive testing of semiconductor packages.

BACKGROUND

Capacitive testing of semiconductor packages allows for the detection of interconnect defects such as improperly spaced wires or leads, sagging wires, etc. through stand-alone electrical testing. Such defects were not detectable, or at least not easily detectable, by conventional x-ray, ATE (automated test equipment), or vector-less testing. Conventional capacitive test methodologies employ a single test channel for the entire package and measure the total or gross capacitive coupling between the probe plate of the test system and the entire package under test. Defect detectability is thus limited to an overall averaging effect. Conventional capacitive test methodologies can detect only single-wire or single-lead defects, such as a single wire with too much sag or a single open electrical pathway in the package. Conventional capacitive test methodologies cannot detect multiple defective connections in the same grouping of electrical connections, such as power lines where many wires are connected together at the same potential and any one of the wires can be defective.

SUMMARY

According to an embodiment of a test apparatus, the test apparatus comprises a multi-channel probe plate and circuitry. The multi-channel probe plate comprises an electrically insulating body with opposing first and second main surfaces, and a plurality of spaced apart electrically conductive coupling regions embedded in or attached to the body at the first main surface. Each of the electrically conductive coupling regions is configured to cover a different zone of a semiconductor package when the semiconductor package is positioned in close proximity to the first main surface of the plate. The circuitry is electrically connected to each of the coupling regions of the probe plate via a different channel. The circuitry is operable to: measure a parameter indicative of the degree of capacitive coupling between each electrically conductive coupling region of the probe plate and the zone of the semiconductor package covered by the corresponding electrically conductive coupling region; provide a capacitance signal based on the parameter measured for each of the electrically conductive coupling regions of the probe plate; and select different ones of the capacitance signals for analysis.

According to an embodiment of a test system, the test system comprises probes configured to contact leads of a semiconductor package and a multi-channel probe plate comprising an electrically insulating body with opposing first and second main surfaces, and a plurality of spaced apart electrically conductive coupling regions embedded in or attached to the body at the first main surface. Each of the electrically conductive coupling regions is configured to cover a different zone of the semiconductor package when the semiconductor package is positioned in close proximity to the first main surface of the plate. The test system further comprises circuitry electrically connected to each of the coupling regions of the probe plate via a different channel. The circuitry is operable to: measure a parameter indicative of the degree of capacitive coupling between each electrically conductive coupling region of the probe plate and the zone of the semiconductor package covered by the corresponding electrically conductive coupling region; provide a capacitance signal based on the parameter measured for each of the electrically conductive coupling regions of the probe plate; and select different ones of the capacitance signals for analysis. The test system also comprises a controller operable to: apply test signals and ground to the semiconductor package via the probes during testing of the semiconductor package; control how the circuitry selects the capacitance signals for analysis; and analyze the capacitance signals provided by the circuitry to determine whether an electrical connection of the semiconductor package in any of the zones of the semiconductor package or between the zones violates one or more test criteria.

According to an embodiment of a capacitive test method for semiconductor packages, the method comprises: positioning a semiconductor package in close proximity to a main surface of a multi-channel probe plate, the probe plate comprising an electrically insulating body and a plurality of spaced apart electrically conductive coupling regions embedded in or attached to the body at the first main surface, each of the electrically conductive coupling regions covering a different zone of the semiconductor package; applying test signals and ground to the semiconductor package; measuring a parameter indicative of the degree of capacitive coupling between each electrically conductive coupling region of the probe plate and the zone of the semiconductor package covered by the corresponding electrically conductive coupling region; providing a capacitance signal based on the parameter measured for each of the electrically conductive coupling regions of the probe plate; and analyzing the capacitance signals to determine whether an electrical connection of the semiconductor package in any of the zones of the semiconductor package or between the zones violates one or more test criteria.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Embodiments described herein provide a more sensitive or finer precision capacitive test method, apparatus and system for semiconductor packages. The embodiments described herein provide a multi-channel probe plate having an electrically insulating body and a plurality of spaced apart electrically conductive coupling regions embedded in or attached to the body. Each of the coupling regions of the multi-channel probe plate is designed to cover a different zone of a semiconductor package under test when the package is positioned in close proximity to the plate. Each zone of the package corresponds to an area of the package positioned under one of the coupling regions of the multi-channel probe plate, and contains electrical connections such as bond wires or metal clips, leads, etc. The amount of capacitive coupling between each coupling region of the probe plate and the corresponding zone of the semiconductor package covered by that coupling region is detected by measuring a parameter indicative of the degree of capacitive coupling. For example, the current in each of the coupling regions or a corresponding voltage can be measured during testing of the semiconductor package.

A capacitance signal based on the parameter measured for each of the electrically conductive coupling regions of the probe plate is provided for analysis. The analysis can involve determining whether an electrical connection within any of the tested zones of the semiconductor package violates one or more test criteria. For example, the test criteria can indicate an open electrical connection such as a broken or unconnected bond wire or lead, improperly spaced wires or leads, a wire with too much sag or droop, etc. In general any suitable criteria for judging if the electrical connections of the tested package zones are within acceptable limits can be used to determine whether the package is 'defective' or 'good'. The multi-channel probe plate described herein forms part of a test apparatus which also includes a controller. The controller analyzes the data provided by the multi-channel probe plate and related circuitry, and controls the operation of the circuitry associated with the probe plate to carry out capacitive testing of the semiconductor package. Various probe plate control embodiments are described in further detail later herein.

Figure 1:
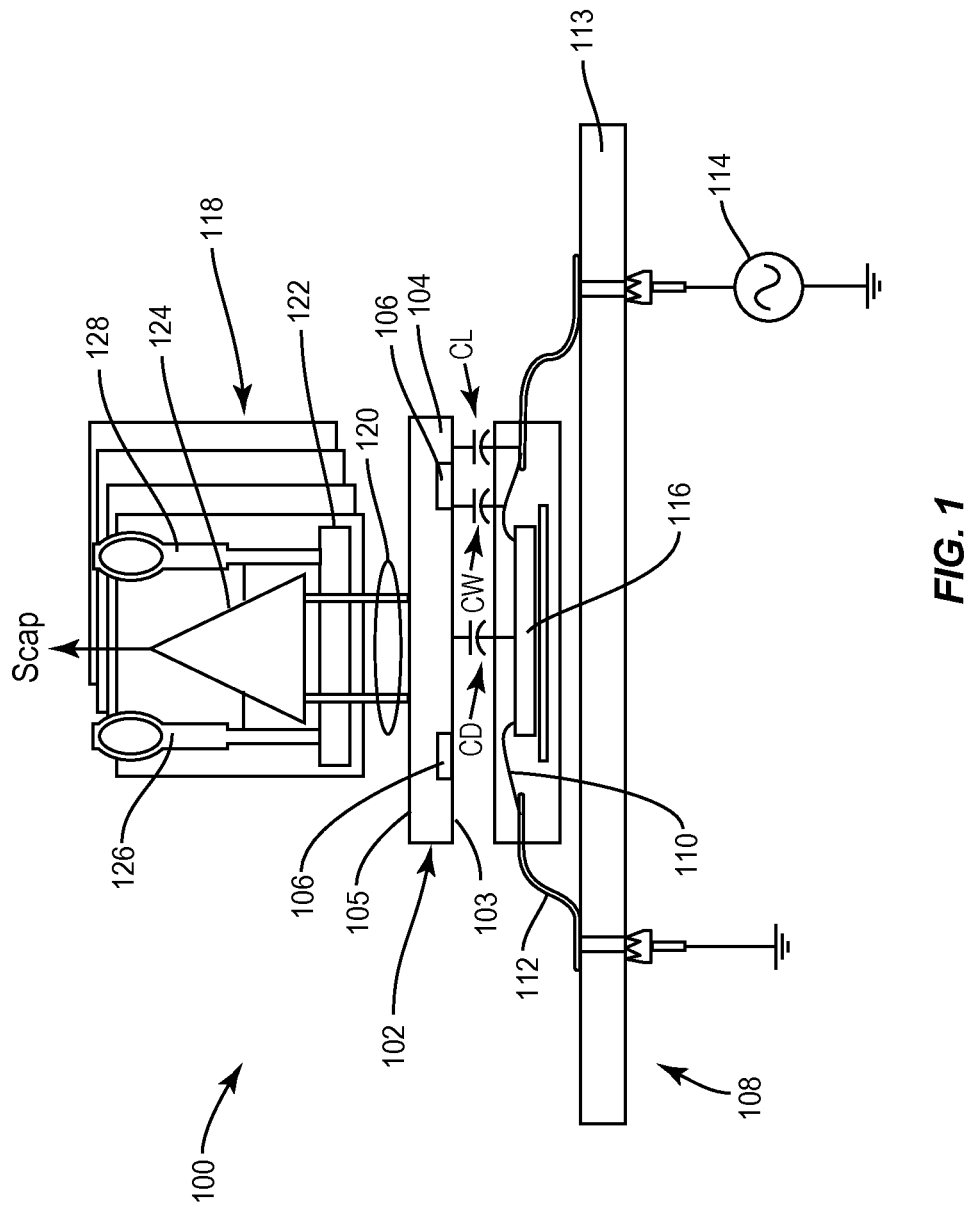
FIG. 1 illustrates an embodiment of a test apparatus.

FIG. 1 illustrates an embodiment of a test apparatus 100 for capacitive testing of semiconductor packages. The test apparatus 100 includes a multi-channel probe plate 102 having an electrically insulating body 104 with opposing first and second main surfaces 103, 105, and a plurality of spaced apart electrically conductive coupling regions 106 embedded in or attached to the body 104 at the first main surface 103. In one embodiment, the body 104 of the probe plate 102 is a printed circuit board, and the electrically conductive coupling regions 106 are conductive pathways, tracks, or signal traces etched from copper sheets laminated onto a non-conductive substrate, such as FR-4. Other probe plate constructions can be used, such as other types of laminates or a ceramic substrate or flexible printed circuit with a metallized side patterned to form the spaced apart electrically conductive coupling regions 106 of the probe plate 102. Each of the coupling regions 106 of the probe plate 102 is configured to cover a different zone of a semiconductor package 108, including the bond wires 110, leads 112, die 116 and possibly part of the substrate 113, when the package 108 is positioned in close proximity to the first main surface 103 of the plate 102.

Figure 2:
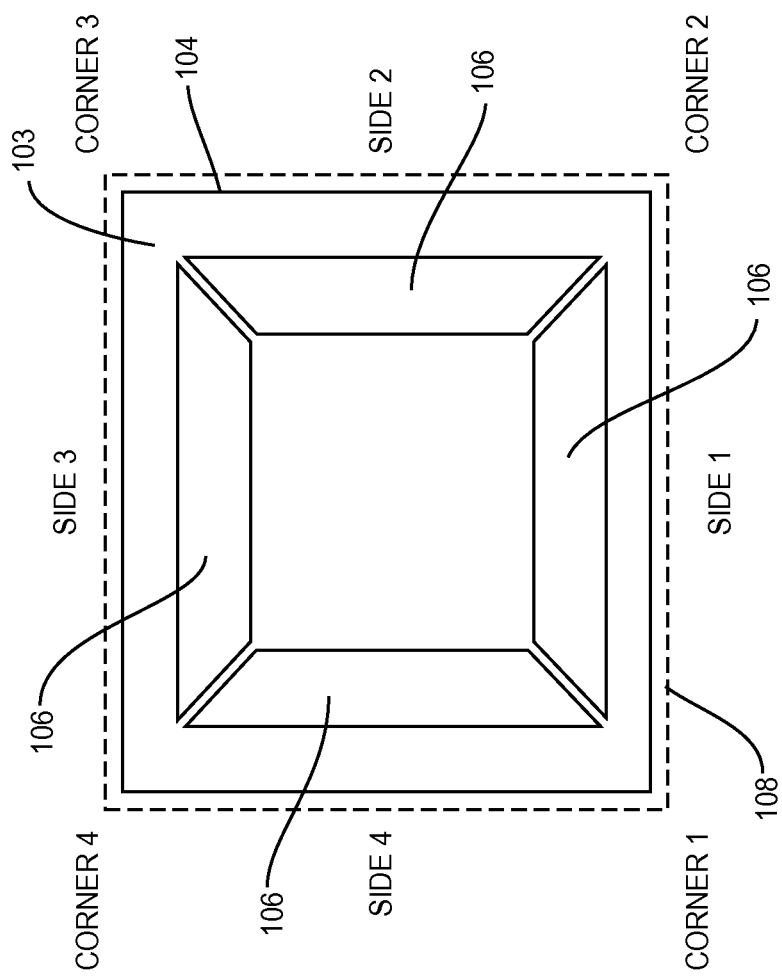
FIG. 2 illustrates a plan view of an embodiment of a multi-channel probe plate included in the test apparatus of FIG. 1.

FIG. 2 illustrates a plan view of the surface 103 of the multi-channel probe plate 102 that faces the semiconductor package 108. The package 108 is superimposed in a transparent manner as indicated by the dashed box in FIG. 2 to indicate the alignment of the probe plate 102 relative to the package 108. According to this embodiment, the probe plate 102 has a single electrically conductive coupling region 106 extending in parallel with each side ('SIDE 1', 'SIDE 2', 'SIDE 3', 'SIDE 4') of the insulating body 104 of the probe plate 102 and spaced apart from the other electrically conductive coupling regions 106 of the probe plate 102. The package 108 is effectively split into four zones under each of the coupling regions 106 of the probe plate 102 according to this embodiment, and the test apparatus 100 can detect a defect in each of the four zones. Such an arrangement allows for the capacitive testing of the electrical connections of the package 108 in four different zones of the package 108. The package zones positioned under the electrically conductive coupling regions 106 of the multi-channel probe plate 102 contain electrical connections such as bond wires or metal clips 110, leads 112, etc. The leads 112 of the package 108 can be attached to a substrate 113, such as a printed circuit board, and provide points of external contact for the internal connections (e.g., bond wires 110) included in the package 108.

Test signals and ground can be applied to the semiconductor package 108 by a test generator 114 for causing capacitive coupling to arise between each electrically conductive coupling region 106 of the probe plate 102 and the zone of the semiconductor package 108 covered by the corresponding coupling region 106. The test signals are AC in nature, and, thus, induce a current in the electrically conductive coupling region 106 positioned over each zone of the package 108 in which the electrical connections are being tested. The zones of the package 108 can be tested sequentially, or more than one zone of the package 108 can be tested at the same time.

In either case, the degree of capacitive coupling between a particular zone of the package 108 under test and the coupling region 106 of the multi-channel plate 102 positioned in close proximity to that zone of the package 108 is a function of several capacitances. The capacitance (CD) between the die 116 included in the package 108 and the coupling region 106 being measured, the capacitance (CW) between the bonding wires 110 in the package zone under test and the corresponding coupling region 106, the capacitance (CL) between the leads 112 in the package zone under test, and the corresponding coupling region 106 each influence the degree of capacitive coupling between the package zone under test and the coupling region 106 of the probe plate 102 positioned in close proximity to that zone of the package 108 during testing.

The test apparatus 100 further includes circuitry 118 electrically connected to each of the coupling regions 106 of the probe plate 102 via a different channel 120, enabling a more sensitive or finer precision capacitive test methodology in that the electrical connections in different zones of the package 108 can be individually tested and observed for defects. For example, the package 108 can have several power lines in different zones of the package. By measuring and analyzing capacitive coupling data obtained from multiple channels 120 of the probe plate 120 in different combinations, significantly better defect detectability is achieved. A wire defect at a power line, which may made by one of multiple wire connections in one or several zones of the package, can be detected effectively. This is not the case with a single-channel probe plate, which lacks the sensitivity to detect such a power line wire defect.

The circuitry 118 included in or associated with the multi-channel probe plate 102 measures a parameter indicative of the degree of capacitive coupling between each electrically conductive coupling region 106 of the probe plate 102 and the zone of the semiconductor package 108 covered by the corresponding electrically conductive coupling region 106. The circuitry 118 also provides a capacitance signal (Soap) based on the parameter measured for each of the coupling regions 106 of the probe plate 102 and selects different ones of the capacitance signals for analysis.

In one embodiment, the parameter measured by the circuitry 118 is the current in each electrically conductive coupling region 106 of the probe plate 102 during application of test signals to the semiconductor package 108. In another embodiment, the parameter is a corresponding voltage. In either case, the circuitry 118 includes a sensor, detector 122 or the like for measuring the parameter and an operational amplifier (Op-Amp) 124 for amplifying the output of the corresponding sensor/detector 122. The Op-Amp 124 has bias terminals 126, 128 for the application of bias signals to the Op-Amp 124. The Op-Amp 124 compares the output of the corresponding sensor/detector 122 to a reference signal and performs amplification to yield a capacitance signal 'Soap' for each of the electrically conductive coupling regions 106 of the multi-channel probe plate 102. The capacitance signals are then analyzed to determine whether any of the zones of the package 108 has a defective or sub-standard electrical connection.

Figure 3:
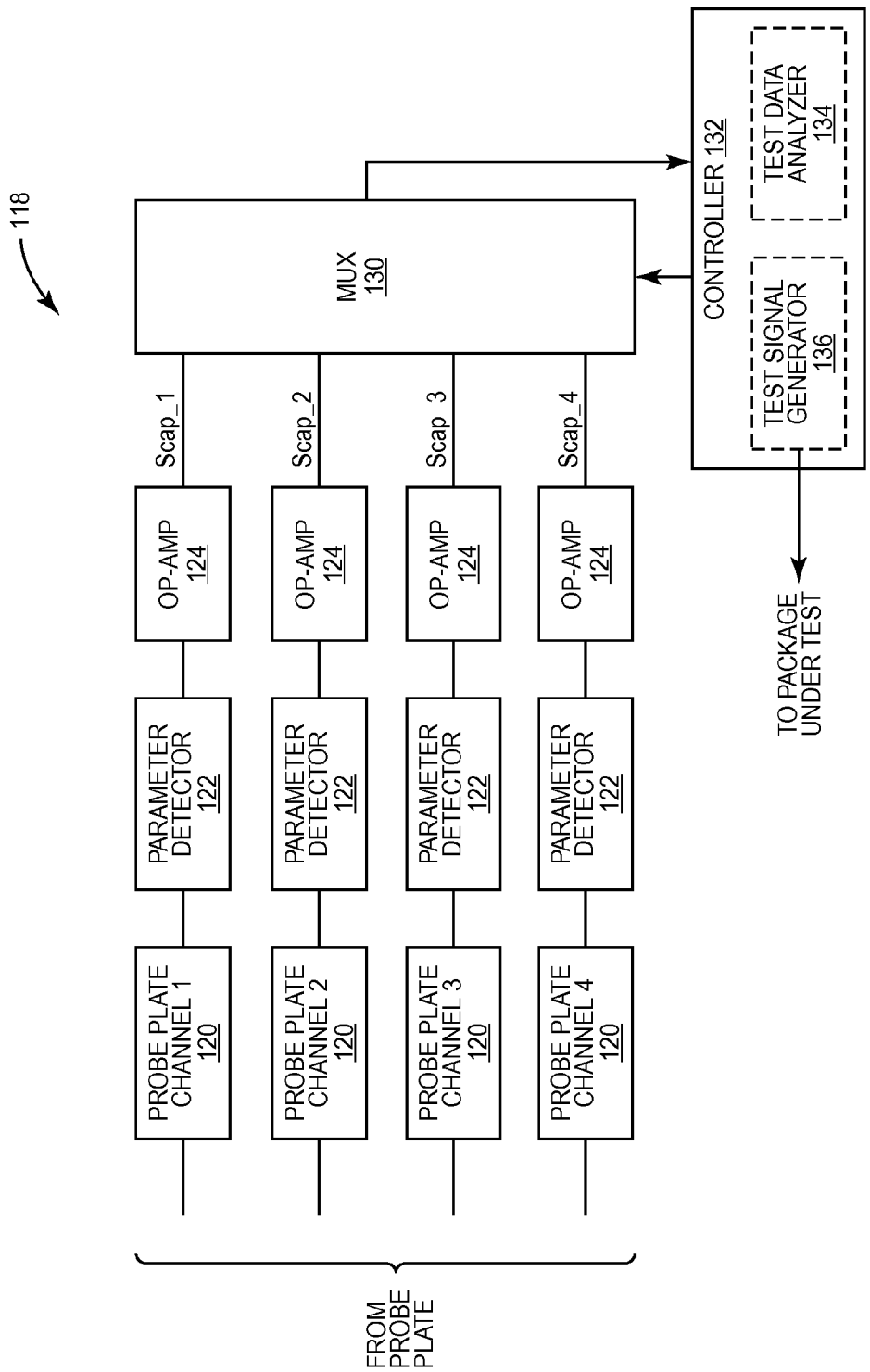
FIG. 3 illustrates a block diagram of an embodiment of circuitry and a controller included in or associated with the test apparatus of FIG. 1.

FIG. 3 illustrates a block diagram of an embodiment of the circuitry 118 included in or associated with the multi-channel probe plate 102. Each channel 120 of the probe plate 102 is connected to a respective parameter sensor/detector 122 for measuring a parameter that indicates the degree of capacitive coupling between each electrically conductive coupling region 106 of the probe plate 102 and the corresponding zone of the semiconductor package 108. In the case the measured parameter is current, the parameter sensors/detectors 122 are current sensors. In the case the measured parameter is voltage, the parameter sensors/detectors 122 are voltage detectors. In either case, the output of each sensor/detector 122 is amplified by a respective Op-Amp 124 to yield a corresponding capacitance signal Scap_n (where 'n' indicates the nth probe plate channel). The capacitance signals are input to a multiplexer (MUX) 130 that selects different ones of the capacitance signals for analysis.

A controller 132 controls how the circuitry 118 included in or associated with the multi-channel probe plate 102 selects the capacitance signals for analysis. The controller 132 can also include a test data analyzer 134 such as a suitably programmed processor or ASIC (application-specific integrated circuit) for analyzing the capacitance signals provided by the multiplexer 130, to determine whether an electrical connection in any of the tested zones of the semiconductor package 108 or between the zones violates one or more test criteria. In general the capacitive test methodologies described herein can use any suitable criteria for judging whether the electrical connections within the tested package zones are within acceptable limits, and, therefore, whether the package is 'defective' or 'good'. A package 108 deemed to be defective can have one or more improperly spaced internal electrical connections, a missing or open electrical connection, a sagging or drooping electrical connection, etc. As such, the terms 'defect' and 'defective' as used herein do not necessarily mean an open or shorted (i.e., completely broken) connection, but can also mean a sub-standard connection, i.e., a connection that is intact but not sufficiently shaped, placed, or spaced. Each of these types of defects renders the package 108 sub-standard for its intended purpose, and, thus, defective. These defects can be readily detected by the capacitive test methodologies described herein.

The controller 132 in conjunction with the multi-channel probe plate 102 and related circuitry 118 form a test system. In addition to controlling the circuitry 118 included in or associated with the probe plate 102, the controller 132 can also control overall testing of the package 108. This can include not only the capacitive test methodology described herein, but also standard functional testing (e.g., logic pass/fail, AC/DC stuck-at-fault testing, functional testing, etc.). To this end, the controller 132 can also include a test signal generator 136 such as a suitably programmed processor or ASIC for applying test signals to the semiconductor package 108 under test. The test signals are applied to the external leads 112 of the package 108. At least some of these test signals are designed or programmed to cause capacitive coupling between the electrically conductive coupling regions 106 of the probe plate 102 and the corresponding zones of the semiconductor package 108 covered by the coupling regions 106. The test signals can be AC in nature, and thus induce a current in each coupling region 106 of the probe plate 102 positioned over a zone of the package 108 in which the electrical connections are being tested. This induced current can be sensed and analyzed to determine whether any of the tested zones of the package 108 are defective.

Figure 4:
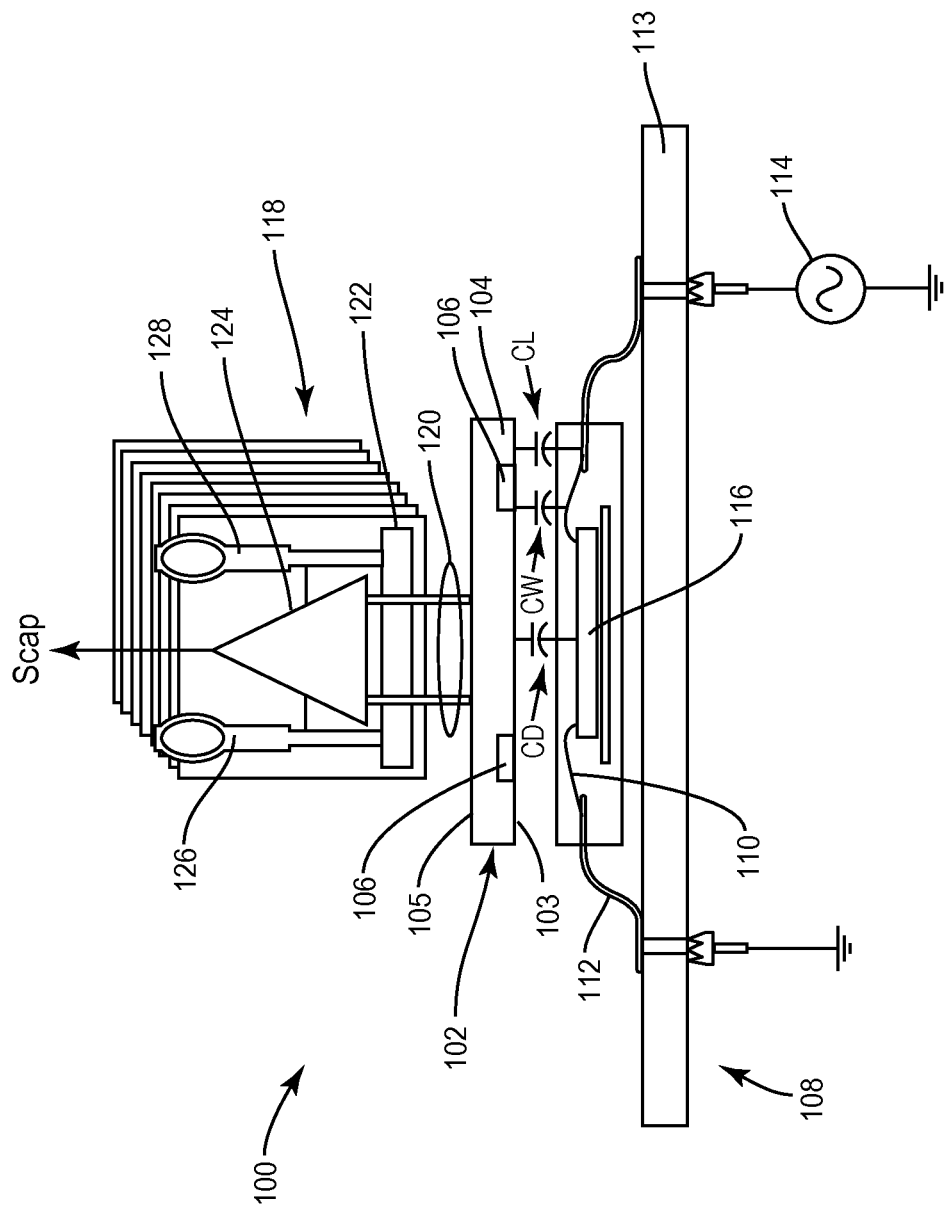
FIG. 4 illustrates another embodiment of a test apparatus.

FIG. 4 illustrates another embodiment of the test apparatus 100 for capacitive testing of semiconductor packages 108. The embodiment shown in FIG. 4 is similar to the one shown in FIG. 1, however, the multi-channel probe plate 102 has at least two spaced apart electrically conductive coupling regions 106 extending in the same plane and in parallel with each side of the insulating body 104 of the probe plate 102.

Figure 5:
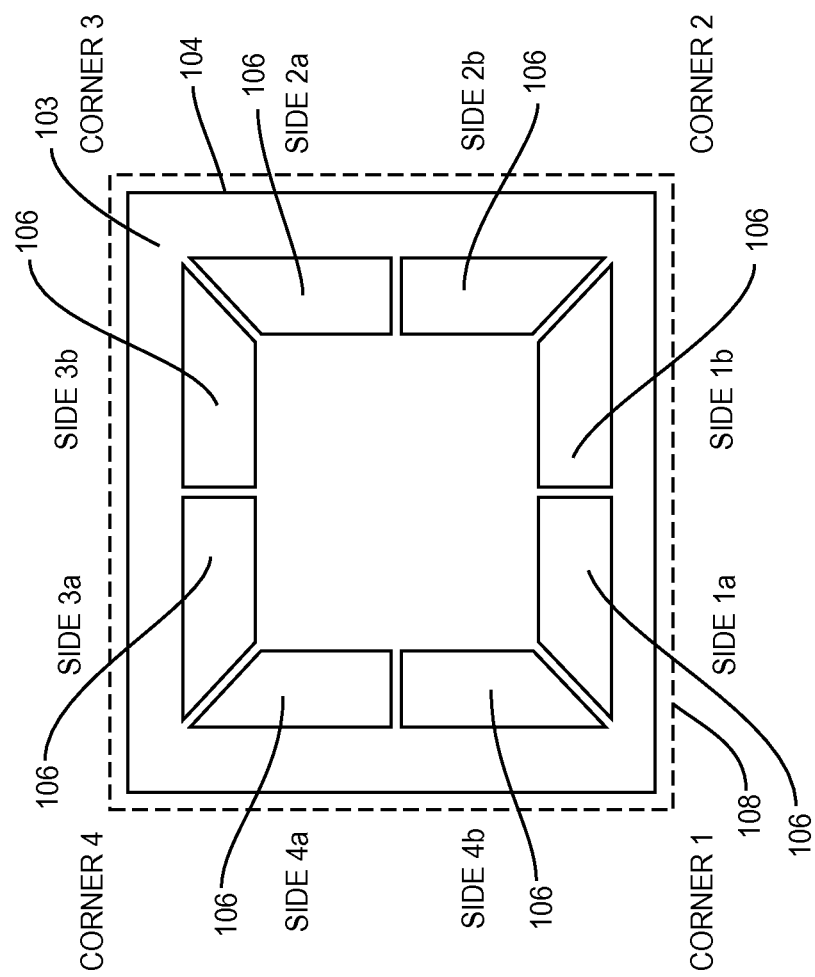
FIG. 5 illustrates a plan view of an embodiment of a multi-channel probe plate included in the test apparatus of FIG. 4.
Figure 6:
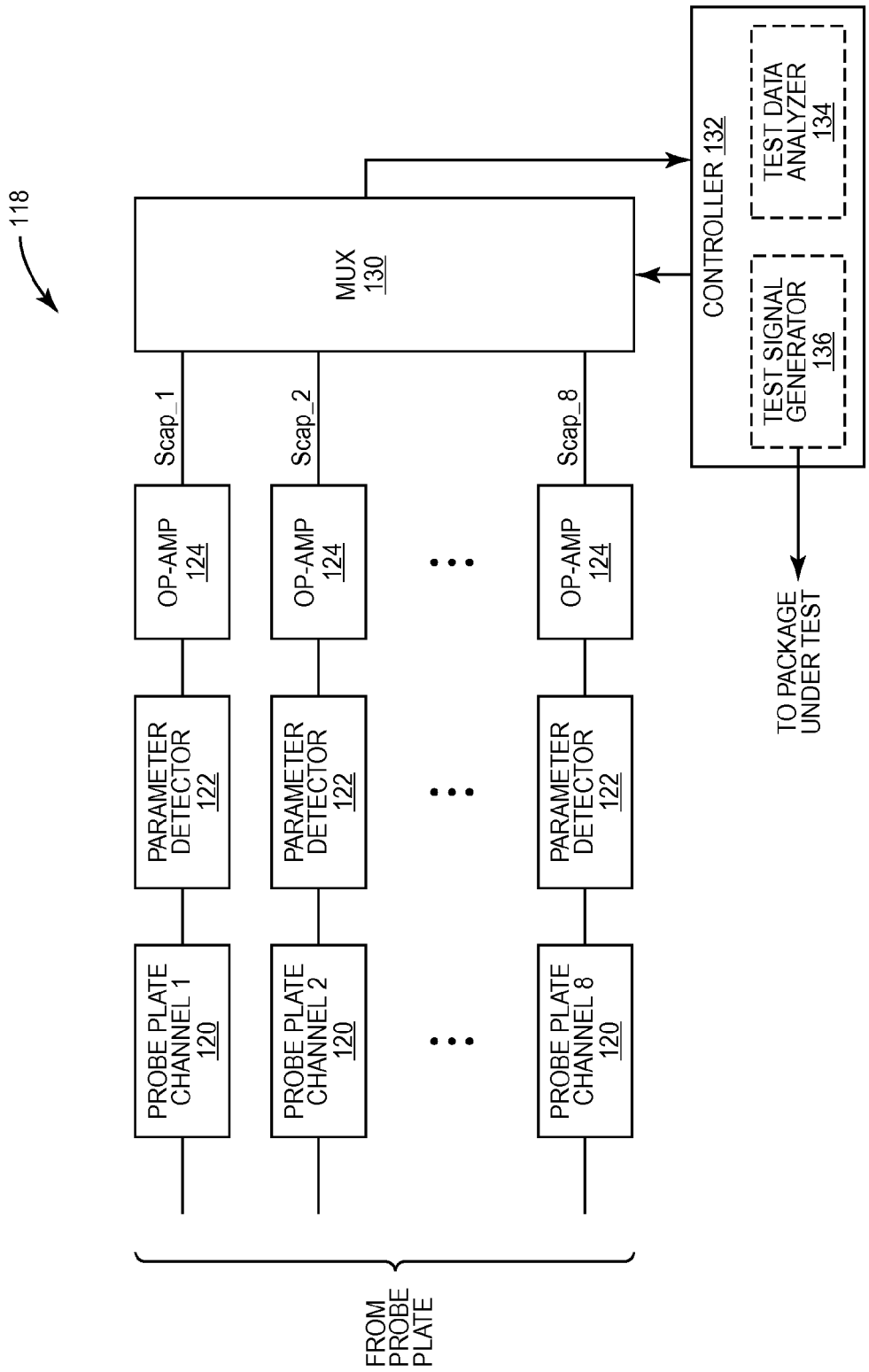
FIG. 6 illustrates a block diagram of an embodiment of circuitry and a controller included in or associated with the test apparatus of FIG. 5.

FIG. 5 illustrates a plan view of the surface 103 of the multi-channel probe plate 102 that faces the semiconductor package 108, and FIG. 6 illustrates the corresponding circuitry 118 included in or associated with the multi-channel probe plate 102. According to this embodiment the probe plate 102 has eight channels 120 with two electrically conductive coupling regions 106 extending in parallel with each side of the insulating body 104 of the probe plate 102 and spaced apart from the other coupling regions 106 of the probe plate 102, and the circuitry 118 is scaled to support each of the eight separate probe plate channels 120. Each side of the probe plate insulating body 104 has two sections ('SIDE 1a', 'SIDE 1b', 'SIDE 2a', 'SIDE 2b', 'SIDE 3a', 'SIDE 3b', 'SIDE 4a', 'SIDE 4b') along each of which is disposed a separate electrically conductive coupling region 106. The package 108 is effectively split into eight zones according to this embodiment, and the test apparatus 100 can detect a defect in each of the eight package zones. The package 108 can have several power lines in several or all of the eight zones. By measuring and analyzing capacitive coupling data obtained from the channels 120 of the probe plate 102 in different combinations, significantly better defect detectability is achieved. For example, a wire defect at a power line, which may made by one of multiple wire connections in one or several zones of the package 108, can be detected effectively.

Four zones (FIG. 3) and eight zones (FIG. 6) are merely given as illustrative examples. The multi-channel probe plate 102 can support other numbers of package zones, e.g., 3, 5, 7, 9, 10, etc. The number of package zones corresponds to the number of probe plate channels 120 provided, and at least partly determines the precision or fineness of the defect detection capability of the test apparatus 100. The effectiveness of the capacitive test methodology also depends on the sequence of testing of the package zones.

For example, each of the zones of the package 108 can be tested sequentially by exciting one package zone at a time with test signals and measuring a parameter such as current or voltage which indicates the degree of capacitive coupling between that package zone and the coupling region 106 of the multi-channel probe plate 102 covering that zone. Such an approach provides for defect testing at each side of the package 108. For package connection defects located between two adjacent coupling regions 106 of the probe plate 102, e.g., in the case of power lines dispersed over several package zones, improved detectability can be achieved by testing adjacent pairs of package zones at the same time and analyzing the results for defects. For example in the case of FIGS. 2 and 5, each corner zone (represented by labels 'CORNER 1', 'CORNER 2', 'CORNER 3', 'CORNER 4') of the package 108 can be analyzed to determine whether the package 108 under test has any connection defects in these zones by applying corresponding test signals. The test signals excite the electrical connections in the corner zones of the package 108 so that the adjacent coupling regions 106 of the probe plate 102 in the corner zone under test are capacitively coupled to the package 108 at the same time. The capacitance signals provided for the pair of coupling regions 106 of the probe plate 102 that abut the corner zone under test can be analyzed to determine whether a defect is present in the corner zone e.g. two bond wires 110 shorted together in the corner zone, where one of the shorted bond wires 110 is disposed under one of the coupling regions 106 of the probe plate 102 and the other shorted bond wire 110 is disposed under an adjacent coupling region 106. In FIG. 2, this means selecting the capacitance signals provided for the pair of coupling regions 106 abutting 'SIDE 3' and 'SIDE 4' of the probe plate 102 to analyze 'CORNER 4', selecting the capacitance signals provided for the pair of coupling regions 106 abutting 'SIDE 1' and 'SIDE 4' of the probe plate 102 to analyze 'CORNER 1', etc. In FIG. 5, this means selecting the capacitance signals provided for the pair of coupling regions 106 abutting 'SIDE 3a' and 'SIDE 4a' of the probe plate 102 to analyze 'CORNER 4', selecting the capacitance signals provided for the pair of coupling regions 106 abutting 'SIDE 1a' and 'SIDE 4b' of the probe plate 102 to analyze 'CORNER 1', etc.

Further in the case of FIG. 5, the test precision can be even further increased in that each side of the probe plate 102 has two coupling regions 106. As such, package defects corresponding to the corner zones of the probe plate 102 and package defects between the coupling regions 106 disposed along the same side of the probe plate 102 can be detected. For example in FIG. 5, this means analyzing the capacitance signals provided for the pair of coupling regions 106 along the same side of the probe plate 102 (e.g., both coupling regions 106 disposed along the side represented by 'SIDE 3a' and 'SIDE 3b' in FIG. 5) to determine whether any defects span these two coupling regions 106 e.g. two bond wires 110 shorted together in along one side of the probe plate 102, where one of the shorted bond wires 110 is disposed under one of the coupling regions 106 of the probe plate 102 and the other shorted bond wire 110 is disposed under an adjacent coupling region 106. In general, the circuitry 118 included in or associated with the multi-channel probe plate 102 can measure the parameter (e.g., current or voltage) for at least some, but not all, of the electrically conductive coupling regions 106 of the probe plate 102 at the same time.

Figure 7:
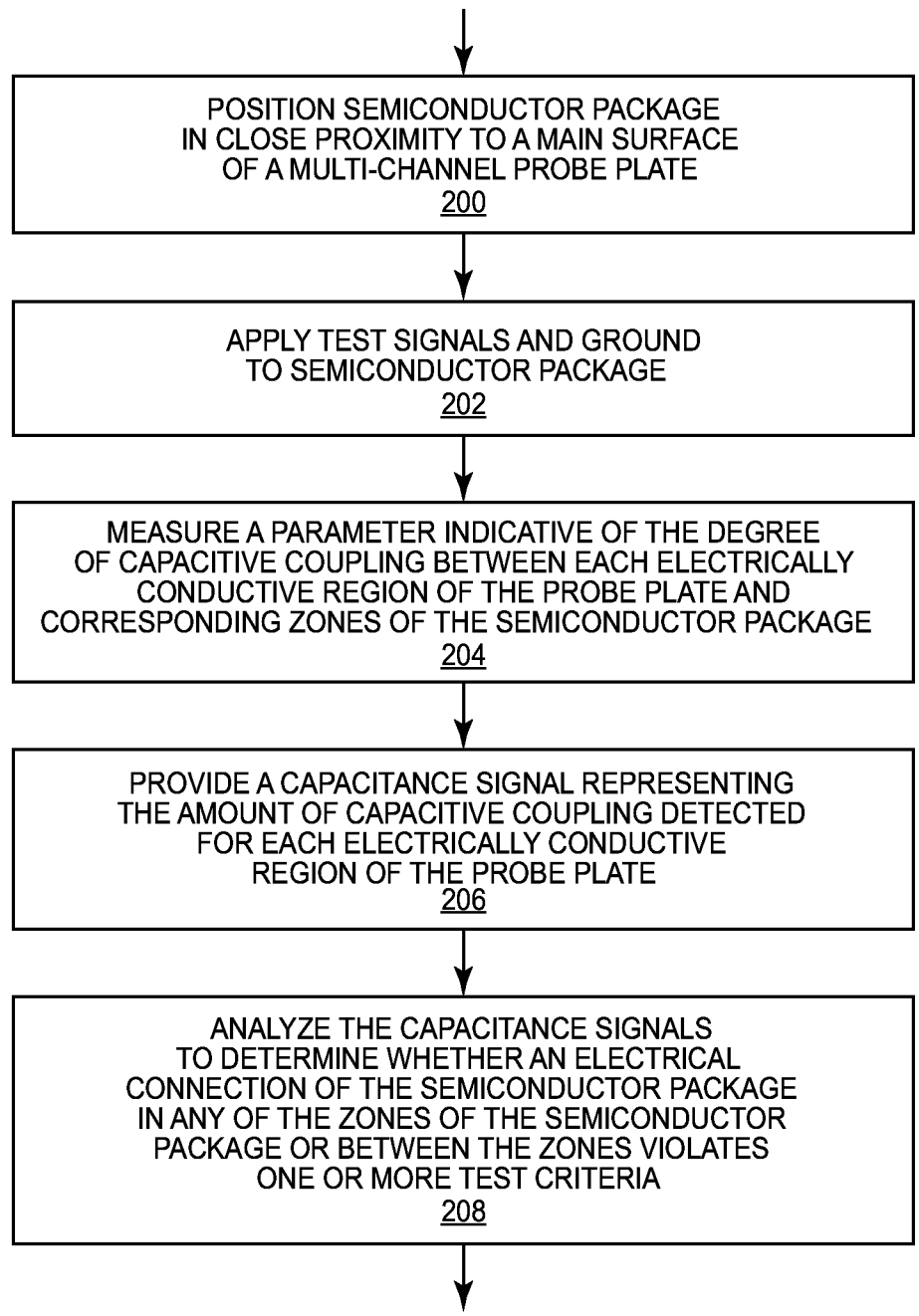
FIG. 7 illustrates an embodiment of a capacitive test method for semiconductor packages.

FIG. 7 illustrates an embodiment of a capacitive test method for semiconductor packages. The method includes positioning a semiconductor package in close proximity to a main surface of a multi-channel probe plate (Block 200). The probe plate includes an electrically insulating body and a plurality of spaced apart electrically conductive coupling regions embedded in or attached to the body at the first main surface, each of the electrically conductive coupling regions covering a different zone of the semiconductor package as previously described herein. The method further includes applying test signals and ground to the semiconductor package (Block 202) and measuring a parameter indicative of the degree of capacitive coupling which arises between each coupling region of the probe plate and the corresponding zones of the package in response to the test signals (Block 204). The method also includes providing a capacitance signal based on the parameter measured for each of the coupling regions of the probe plate (Block 206) and analyzing the capacitance signals to determine whether an electrical connection of the semiconductor package in any of the tested zones of the semiconductor package or between the zones violates one or more test criteria (Block 208).

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an", and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A test apparatus, comprising:
   a multi-channel probe plate comprising an electrically insulating body with opposing first and second main surfaces, and a plurality of spaced apart electrically conductive coupling regions embedded in or attached to the body at the first main surface, each of the electrically conductive coupling regions configured to cover a different zone of a semiconductor package when the semiconductor package is positioned in close proximity to the first main surface of the plate; and
   circuitry electrically connected to each of the coupling regions of the probe plate via a different channel, the circuitry operable to measure a parameter indicative of the degree of capacitive coupling between each elec- trically conductive coupling region of the probe plate and the zone of the semiconductor package covered by the corresponding electrically conductive coupling region.

2. The test apparatus of claim 1, wherein the probe plate comprises a single electrically conductive coupling region extending in parallel with each side of the body and spaced apart from the other electrically conductive coupling regions of the probe plate.

3. The test apparatus of claim 1, wherein the probe plate comprises at least two spaced apart electrically conductive coupling regions extending in the same plane and in parallel with each side of the body.

4. The test apparatus of claim 1, wherein the circuitry comprises amplifier circuitry operable to amplify the parameter measured for each of the electrically conductive coupling regions of the probe plate to provide capacitance signals.

5. The test apparatus of claim 4, wherein the circuitry comprises a multiplexer operable to select different ones of the capacitance signals for analysis.

6. The test apparatus of claim 5, wherein pairs of adjacent ones of the electrically conductive coupling regions extend in planes that intersect perpendicular to each other in corner zones of the probe plate, and the wherein multiplexer is operable to select the capacitance signals for one pair of the electrically conductive coupling regions at the same time for analysis.

7. The test apparatus of claim 1, wherein the circuitry is operable to measure the parameter for at least some but not all of the electrically conductive coupling regions of the probe plate at the same time.

8. The test apparatus of claim 7, wherein the circuitry is operable to measure the parameter for pairs of adjacent ones of the electrically conductive coupling regions of the probe plate at the same time.

9. A test system, comprising:
probes configured to contact leads of a semiconductor package;
a multi-channel probe plate comprising an electrically insulating body with opposing first and second main surfaces, and a plurality of spaced apart electrically conductive coupling regions embedded in or attached to the body at the first main surface, each of the electrically conductive coupling regions configured to cover a different zone of the semiconductor package when the semiconductor package is positioned in close proximity to the first main surface of the plate;
circuitry electrically connected to each of the coupling regions of the probe plate via a different channel, the circuitry operable to measure a parameter indicative of the degree of capacitive coupling between each electrically conductive coupling region of the probe plate and the zone of the semiconductor package covered by the corresponding electrically conductive coupling region; and
a controller operable to apply test signals and ground to the semiconductor package via the probes during testing of the semiconductor package and analyze capacitance signals provided by the circuitry to determine whether an electrical connection of the semiconductor package in any of the zones of the semiconductor package or between the zones violates one or more test criteria.

10. The test system of claim 9, wherein the circuitry is operable to provide to the controller for analysis a capacitance signal based on the parameter measured for each of the electrically conductive coupling regions of the probe plate and select different ones of the capacitance signals for analysis, and wherein the controller is operable to control how the circuitry selects the capacitance signals for analysis.

11. The test system of claim 9, wherein the probe plate comprises a single electrically conductive coupling region extending in parallel with each side of the body and spaced apart from the other electrically conductive coupling regions of the probe plate.

12. The test system of claim 9, wherein the probe plate comprises at least two spaced apart electrically conductive coupling regions extending in the same plane and in parallel with each side of the body.

13. The test system of claim 9, wherein the circuitry comprises:
amplifier circuitry operable to amplify the parameter measured for each of the electrically conductive coupling regions of the probe plate to provide the capacitance signals; and
a multiplexer operable to select different ones of the capacitance signals for analysis by the controller.

14. The test system of claim 13, wherein pairs of adjacent ones of the electrically conductive coupling regions extend in planes that intersect perpendicular to each other in corner zones of the probe plate, and the multiplexer is operable to select the capacitance signals for one pair of the electrically conductive coupling regions at the same time for analysis by the controller.

15. The test system of claim 9, wherein the circuitry is operable to measure the parameter for each of the electrically conductive coupling regions of the probe plate by detecting the current in each of the electrically conductive coupling regions during application of the test signals to the semiconductor package.

16. The test system of claim 15, wherein the controller is operable to control the circuitry to measure the parameter for pairs of adjacent ones of the electrically conductive coupling regions of the probe plate at the same time.

17. A capacitive test method for semiconductor packages, the method comprising:
positioning a semiconductor package in close proximity to a main surface of a multi-channel probe plate, the probe plate comprising an electrically insulating body and a plurality of spaced apart electrically conductive coupling regions embedded in or attached to the body at the first main surface, each of the electrically conductive coupling regions covering a different zone of the semiconductor package;
applying test signals and ground to the semiconductor package;
measuring a parameter indicative of the degree of capacitive coupling between each electrically conductive coupling region of the probe plate and the zone of the semiconductor package covered by the corresponding electrically conductive coupling region; and
analyzing capacitance signals to determine whether an electrical connection of the semiconductor package in any of the zones of the semiconductor package or between the zones violates one or more test criteria.

18. The method of claim 17, wherein measuring the parameter for each of the electrically conductive coupling regions of the probe plate comprises detecting the current in each of the electrically conductive coupling regions during application of the test signals to the semiconductor package.

19. The method of claim 17, wherein the parameter is measured for at least some but not all of the electrically conductive coupling regions of the probe plate at the same time.

20. The method of claim 19, wherein the parameter is measured for pairs of adjacent ones of the electrically conductive coupling regions of the probe plate at the same time.

\* \* \* \* \*